United States Patent
Dong

(10) Patent No.: US 6,338,630 B1
(45) Date of Patent: Jan. 15, 2002

(54) BOARD-TO-BOARD CONNECTOR WITH IMPROVED CONTACTS

(75) Inventor: Shun Chi Dong, San Jose, CA (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/627,360

(22) Filed: Jul. 28, 2000

(51) Int. Cl.$^7$ ................................................ H01R 4/02
(52) U.S. Cl. ............................................ 439/74; 439/83
(58) Field of Search ......................... 439/74, 83, 660, 439/79

(56) References Cited

U.S. PATENT DOCUMENTS

| | | | | |
|---|---|---|---|---|
| 5,731,958 A | * | 3/1998 | Kozel | 439/83 |
| 5,735,696 A | * | 4/1998 | Nitsu et al. | 439/65 |
| 6,135,785 A | * | 4/1998 | Niitsu | 439/74 |
| 5,836,773 A | * | 11/1998 | McHugh et al. | 439/74 |
| 5,876,217 A | * | 3/1999 | Ito et al. | 439/74 |

* cited by examiner

Primary Examiner—Gary Paumen
(74) Attorney, Agent, or Firm—Wei Te Chung

(57) ABSTRACT

A board-to-board connector 1 mounted on a PCB 10 comprises an insulative housing 12 and a set of first and second contacts 14, 16 alternately engaged with the housing. Each first contact and each second have a similar structure except for two aspects described below. Each first contact comprises a solder portion 146 having a longer length than that of each second contact and having a solder section 1464 with a top face 1463. A support post 1662 projects from the solder portion 166 of each second contact and has a top face 1663. The top faces 1463, 1663 are located at different levels for separately contact with a heat source during a solder repair process, thereby avoiding formation of a short circuit due to a bridge phenomenon.

1 Claim, 5 Drawing Sheets

BOARD-TO-BOARD CONNECTOR WITH IMPROVED CONTACTS

FIELD OF THE INVENTION

The present invention relates to a board-to-board connector, and particularly to a board-to-board connector having an improved arrangement of contacts.

BACKGROUND OF THE INVENTION

Board-to-board connectors are commonly used in the computer field. Examples include U.S. Pat. Nos. 5,735,696 and 5,836,773. Referring to FIG. 5, a prior art board-to-board connector 14 shown in U.S. Pat. No. 5,836,773 comprises an insulative housing 16 and two rows of contacts 20 received in corresponding passageways 18 defined in the housing 16 for mating with a plug connector (not shown). Each contact 20 comprises an engaging apex 34, a main body 26 and a tail section 24 extending from the main body 26. The tail portions 24 of each row of the contacts 20 are arranged in a line for soldering to a printed circuit board (PCB) (not shown). With the development trend toward high density of elements in computers, the pitch between two adjacent contacts 20 is becoming shorter and shorter. Thus, a bridge phenomenon can form a short circuit between two adjacent solder portions 24 of the contacts 20 during soldering and adversely affects signal transmission of the connector 14 and the electrical devices connected thereto.

Hence, an improved board-to-board connector is required to overcome the disadvantages of the prior art.

BRIEF SUMMARY OF THE INVENTION

A main object of the present invention is to provide a board-to-board connector which provides a fine pitch contact arrangement while avoiding a bridge phenomenon between two adjacent contacts during both a normal soldering process and a solder repair process.

To fulfil the above-mentioned object, a board-to-board connector mounted on a PCB in accordance with the present invention comprises an insulative housing and a set of first and second contacts. The insulative housing comprises a central portion which defines two rows of passageways along opposite sides thereof for alternately receiving the first and second contacts. Two channels are communicatively positioned beside these two rows of passageways for receiving a plug connector. The first and second contacts have a similar structure except for solder portions thereof. The solder portion of the first contact is longer than that of the second contact and comprises a bridge portion and a solder section for soldering to a corresponding pad of a PCB. A notch is defined below the bridge portion. The solder portion of each second contact is located between and adjacent two bridge portions of neighboring contacts and forms a support post projecting upward. The top face of the solder section of each first contact and the top face of the support post of each second contact are adapted for contacting a heat source during a solder repair process, the former being located lower than the latter, thereby avoiding a bridge phenomenon with a short forming between adjacent contacts.

Other objects, advantages and novel features of the invention will become more apparent from the following detailed description of the present embodiment when taken in conjunction with the accompanying drawings.

DETAILED DESCRIPTION OF THE INVENTION

Figure 1:
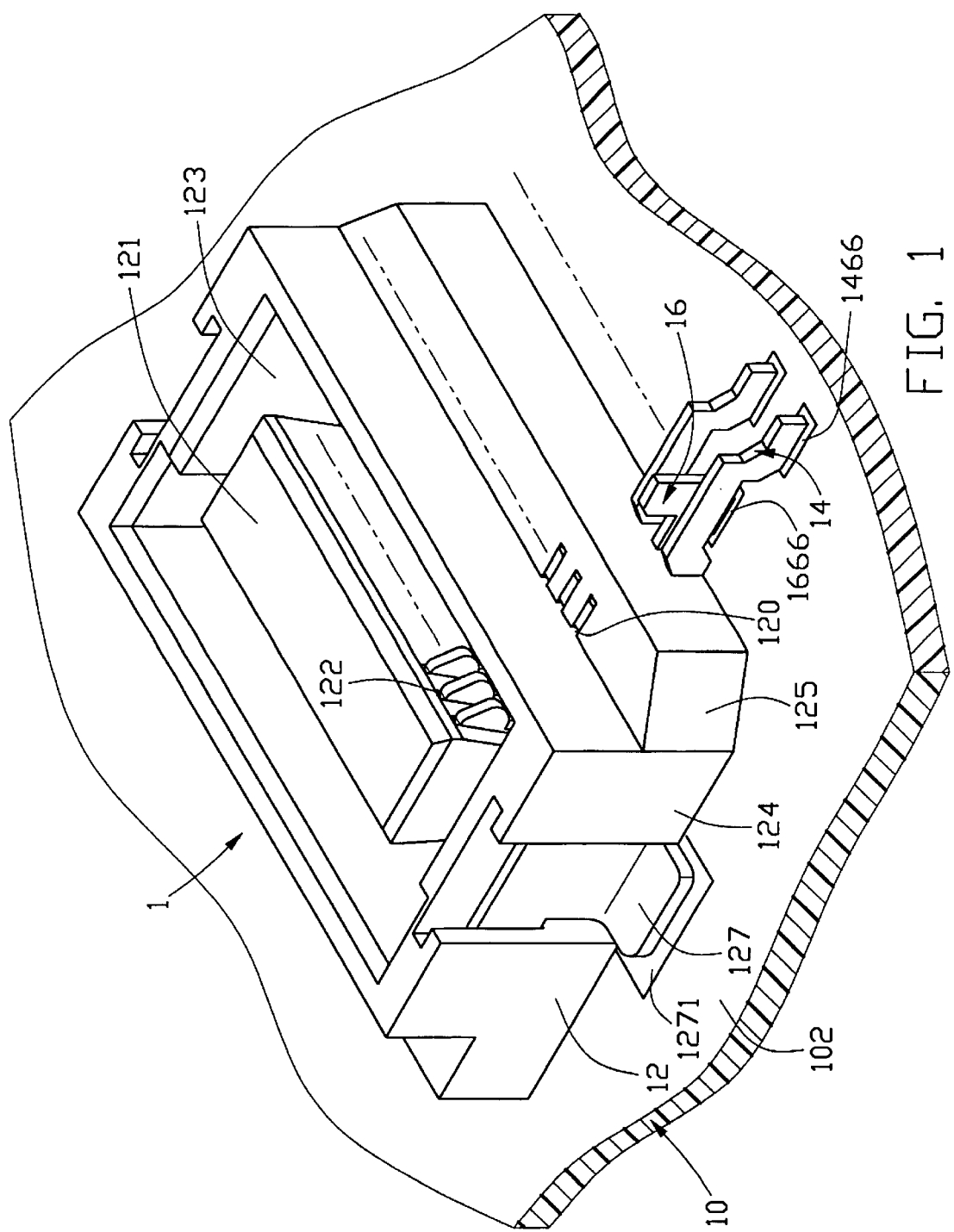
FIG. 1 is a perspective view of a board-to-board connector of the present invention mounted on a PCB.
Figure 2:
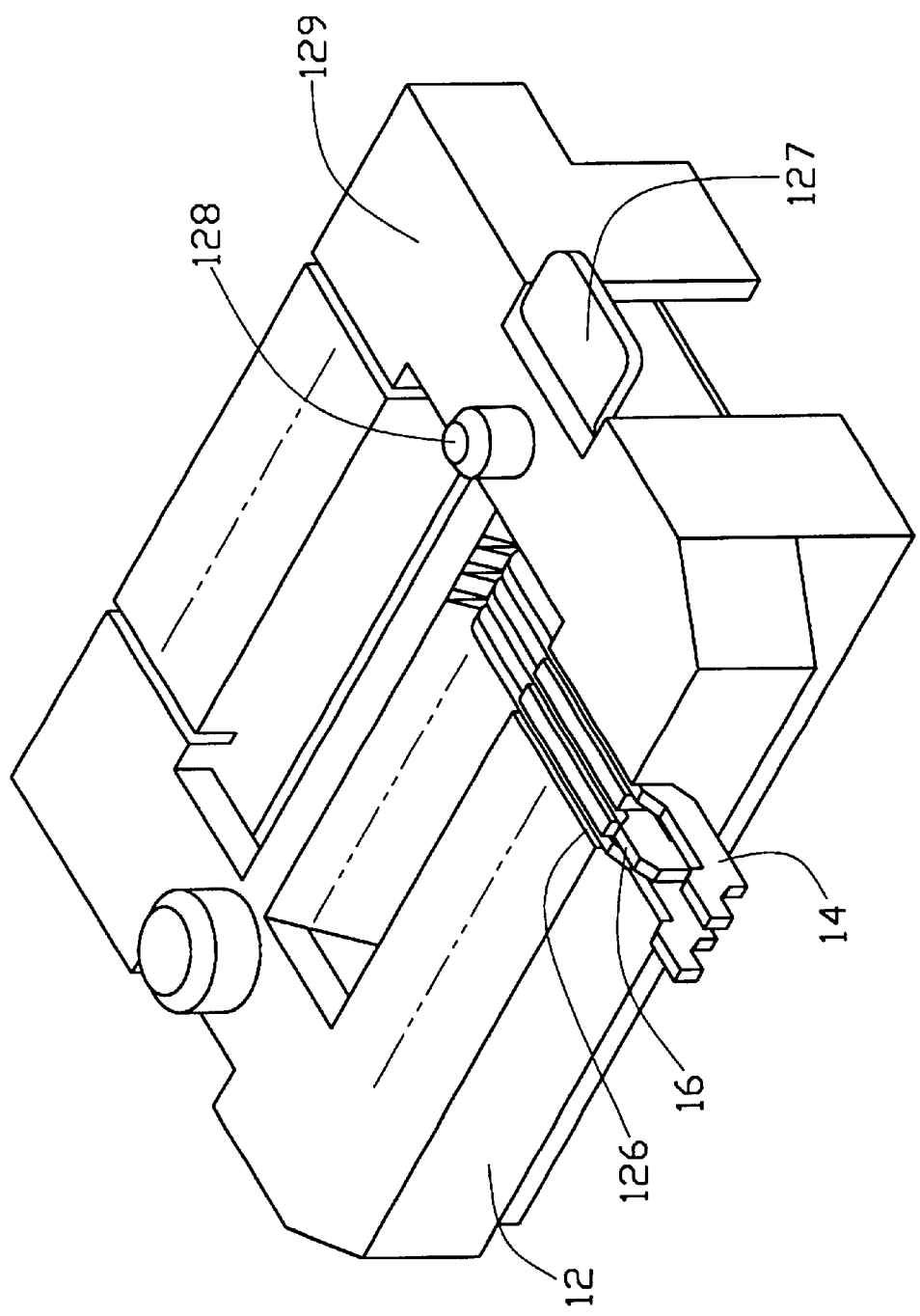
FIG. 2 is a perspective view of the connector from a bottom aspect.

Referring to FIGS. 1 and 2, a board-to-board connector 1 in accordance with the present invention comprises an elongate insulative housing 12 and a set of first and second contacts 14 and 16 alternately mounted on two sides of the housing 12.

The insulative housing 12 comprises a central portion 121 which has a trapeziform cross section (FIG. 4) and defines two rows of passageways 122 in opposite sides thereof. Two lengthwise channels 123 are communicatively positioned beside these two rows of passageways 122 and are bounded an outer side by a peripheral side wall 124 of the housing 12 for receiving an insulative housing 22 of a plug connector 2 (FIG. 4) that is engagable with the board-to-board connector 1. The peripheral side wall 124 forms a pair of side wings 125 extending outward, each of which defines a row of slots 126 in a bottom surface 129 thereof. Each slot 126 is continuous from a corresponding passageway 122. A row of vertical holes 120 extends through an inner portion of each side wing 125 and each hole 120 communicates with a corresponding slot 126. A pair of tags 127 are received in the housing 12 and partially extend beyond front and rear faces of the housing 12 for being mounted onto a PCB 10. A pair of positioning posts 128 aligning with and between the tags 127 depend from the bottom surface 129 of the housing 12 for insertion into holes (not shown) of the printed circuit board.

Figure 3:
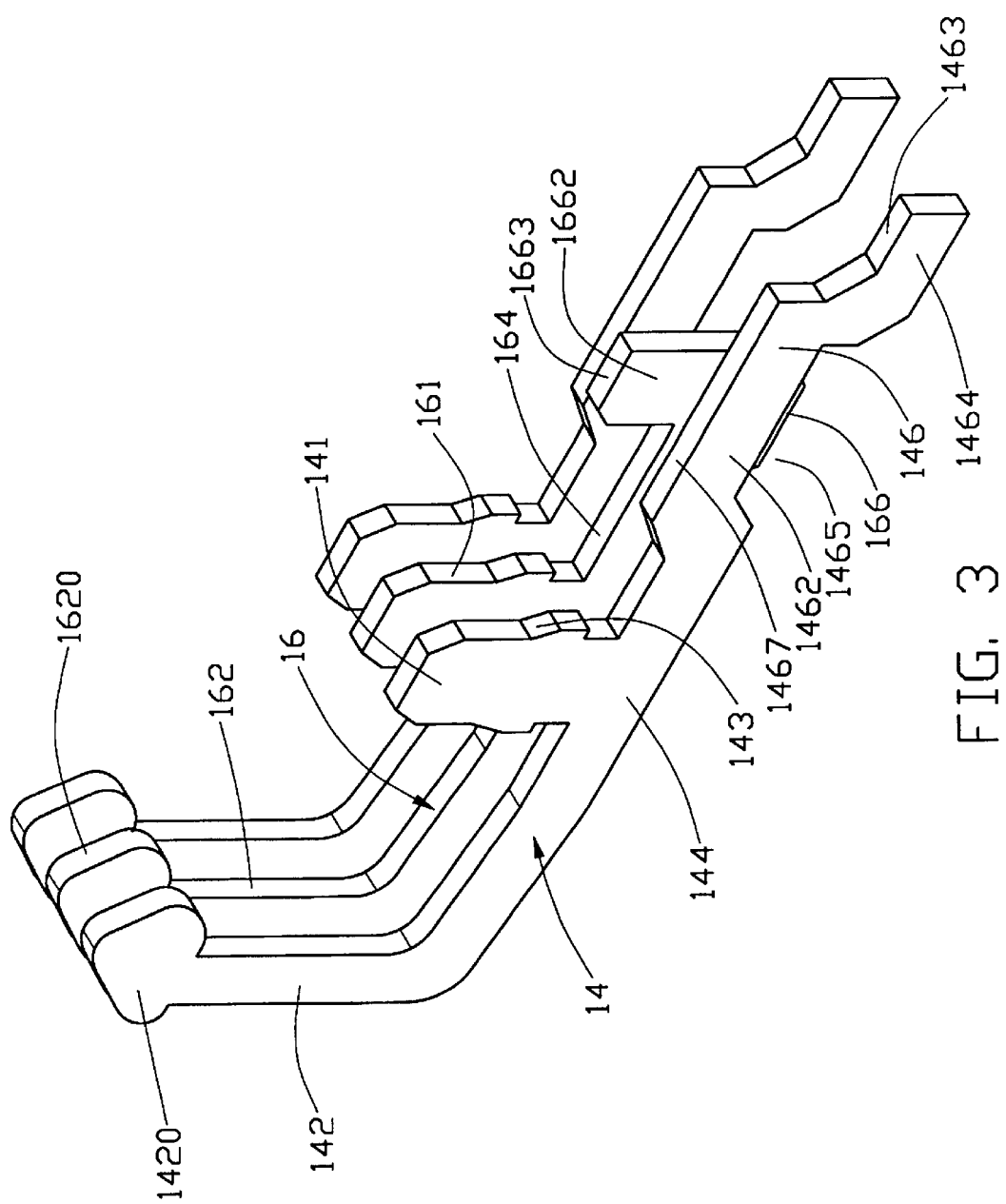
FIG. 3 is a perspective view of three contacts of the board-to-board connector of the present invention.
Figure 4:
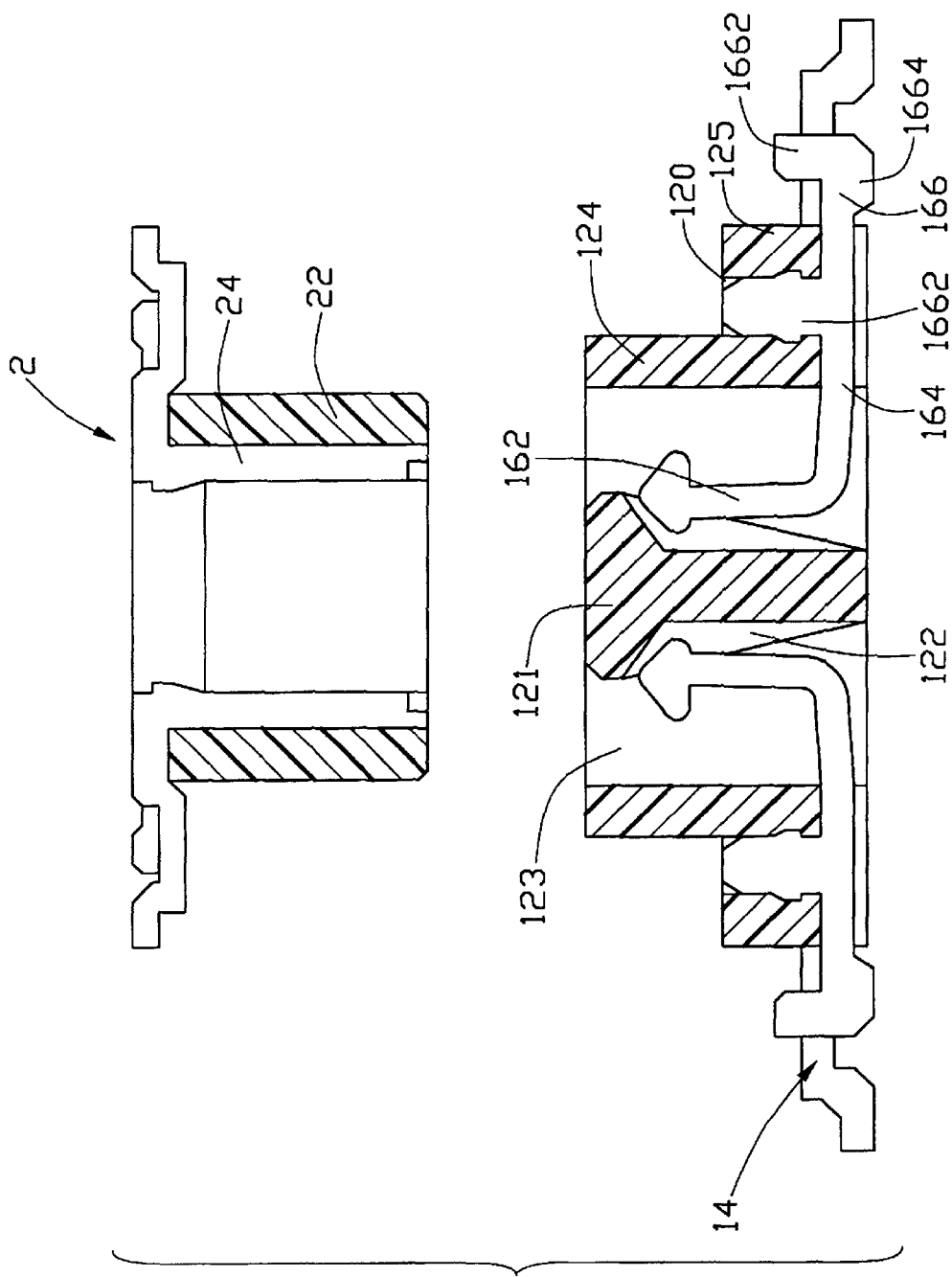
FIG. 4 is a cross-sectional view of the board-to-board connector of the present invention and a mating plug electrical connector.
Figure 5:
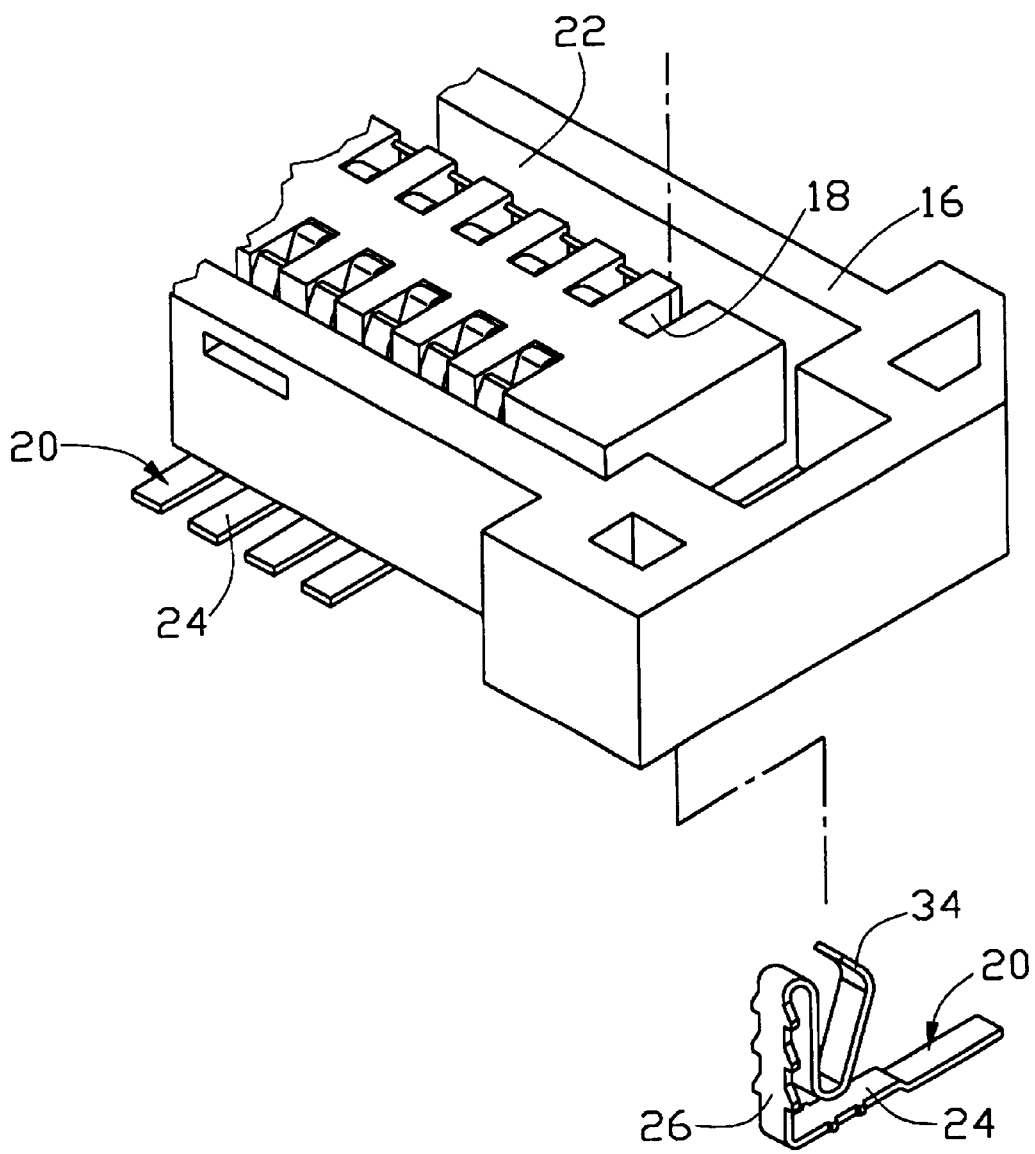
FIG. 5 is a prior art board-to-board connector.

Also referring to FIGS. 3 to 4, the first contacts 14 and the second contacts 16 are engaged within the passageways 122 in an alternating order. Each first contact 14 comprises a vertical contact portion 142, a retaining portion 144 extending horizontally from the contact portion 142 and a solder portion 146 extending further horizontally from the retaining portion 144. Each contact portion 142 forms an arcuate head 1420 for engaging with a corresponding terminal 24 of the plug connector 2. A latching post 141 projects upward from the retaining portion 144 and forms a pair of barbs 143 on opposite sides thereof for latching in the vertical hole 120 of the housing 12. The solder portion 146 comprises a bridge portion 1462 extending outwardly and upwardly from the retaining portion 144 and a solder section 1464 extending outwardly and downwardly from the bridge portion 1462 for soldering to a pad 1466 on the printed circuit board 10. A notch 1465 is defined below the bridge portion 1462 for obstructing a bridge phenomenon from being formed between the bridge portion 1462 and an adjacent solder portion 166 of the second contact 16 during a soldering process or a soldering repair process. The solder section 1464 has a top face 1463 for being in contact with a heat source (not shown). The top face 1463 is located below a top surface 1467 of the bridge portion 1462.

Each second contact 16 has the same structure as that of the first contact 14 except for the solder portion 166 thereof, as will be described below. The solder portion 166 of each second contact 16 extends from a retaining portion 164 thereof. The solder portion 166 of each second contact 16 has a shorter length than the solder portion 146 of each first contact 14. A solder section 1664 and a support post 1662 extend downward and upward from the solder portion 166, respectively. The support post 1662 has a top face 1663 for being in contact with the heat source and is located above the top surface 1467 of the bridge portion 1462 of the first contact 14.

In assembly, referring to FIGS. 1 to 4, the first and second contacts 14, 16 are staggerly inserted into the housing 12 from a bottom of the housing 12. The contact portions 142/162 of the contacts 14/16 are inserted into the channels 123 with the arcuate heads 1420/1620 thereof partially engaged with the corresponding passageways 122. The retaining portions 144/164 extend through the channels 123 and the slots 126 of the housing 12 with the latching posts 141/161 thereof retained in corresponding holes 120 of the housing 12. The housing 12 is then mounted onto the PCB 10. The positioning posts 128 are inserted into corresponding holes of the PCB 10. The tags 127 abut against corresponding solder pads 1271 (only one shown) on a top face 102 of the PCB 10. The solder sections 1464/1664 abut against corresponding solder pads 1466/1666, respectively. Finally, the connector 1 together with the PCB 10 is subject to a reflow process to surface mount the connector 1 to the PCB 10.

In the present invention, the solder sections 1464/1664 of two neighbor contacts 14/16 of the same row are spaced from each other with a distance greater than a pitch of the contacts because the placement of the pads 1466/1666 is staggered, being arranged along two lines rather than being arranged along one line. Thus, the distance between two neighboring solder sections of the contacts is increased, helping to avoid the solder bridge phenomenon, while the pitch of the contacts remains unchanged.

If the soldering of any of the solder sections is defective, for example, because of a void soldering, a solder repair can be made. A solder iron can be brought into contact with the top face 1463/1663 of the solder section 1464/support post 1662 of the solder portion 146/166 of the related contacts 14/16 to heat the solder section 1464/1664 thereof whereby solder can be applied to the concerned solder section 1464/1664 to complete the solder repair. Since the top faces/surfaces 1463, 1663/1467 are located on different levels and the notches 1465 are formed by the first contacts 14, the solder repair process of one contact will not inadvertently affect the solder section of a neighboring contact, thereby avoiding a bridge phenomenon between adjacent contacts.

In use, the plug connector 2 is inserted into the channels 123 of the housing 12 with the terminals 24 thereof contacting with corresponding contacts 14, 16 of the board-to-board connector 1.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A board-to-board connector adapted for being mounted on a printed circuit board having a plurality of first and second pads and being engagable with a plug connector, said board-to-board connector comprising:

an insulative housing comprising a central portion defining two rows of passageways along opposite sides thereof, two lengthwise channels communicatively defined beside the two rows of passageways and bounded an outer side by a peripheral side wall of the housing; and a set of first contacts and a set of second contacts, the first and the second contacts being disposed in an alternating pattern in each of the two rows of passageways of the housing, each first contact comprising a contact portion received in the channel for engaging with the plug connector and a solder portion for being soldered to a first pad of the printed circuit board, the solder portion forming a solder section having a top face for being in contact with a heat source during a solder repair process, each second contact comprising a contact portion received in the channel for engaging with the plug connector and a solder portion with a support post, the solder portion having a solder section for being soldered to a second pad of the printed circuit board and the support post having a top face, said top face of the second contact being located above the top face of the solder section of the first contact for being in contact with the heat source during a solder repair process;

wherein the contact portion of each first and second contact forms an arcuate head received in a corresponding passageway of the housing;

wherein each first contact and each second contact comprises a retaining portion located between the contact portion and the solder portion and wherein the peripheral side wall defines inn a bottom surface thereof two rows of slots each communicating with a corresponding passageway for receiving the retaining portions of the first and second contacts;

wherein a latching post extends upwardly from the retaining portion of each first and second contact and forms a pair of barbs on opposite sides thereof and wherein the peripheral side wall of the housing forms a pair of side wings each defining a row of vertical holes communicating with corresponding slots for interferingly engaging with the latching posts of the first and second contacts;

wherein the solder portion of each first contact comprises a bridge portion extending between the retaining portion and the solder section thereof and having a top surface located above the top face of the solder section thereof and below the top face of the support post of the second contact;

wherein a notch is defined below the bridge portion;

wherein the retaining portion of each second contact has a shorter length than the retaining portion of each first contact;

wherein the solder section of each second contact is located adjacent the bridge portions of two neighboring first contacts.

* * * * *